(12) United States Patent
Huang et al.

(10) Patent No.: US 6,641,971 B2
(45) Date of Patent: Nov. 4, 2003

(54) RESIST COMPOSITIONS COMPRISING SILYL KETALS AND METHODS OF USE THEREOF

(75) Inventors: Wu-Song Huang, Poughkeepsie, NY (US); David R. Medeiros, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 09/882,234

(22) Filed: Jun. 15, 2001

(65) Prior Publication Data

US 2002/0197556 A1 Dec. 26, 2002

(51) Int. Cl.$^7$ .................. G03F 7/023; G03F 7/039; G03F 7/30
(52) U.S. Cl. .................. 430/189; 430/270.1; 430/313; 430/317; 430/323; 430/905
(58) Field of Search .................. 430/270.1, 905, 430/313, 317, 323, 189

(56) References Cited

U.S. PATENT DOCUMENTS

| | | | |
|---|---|---|---|
| 5,627,006 A | * 5/1997 | Urano et al. | 430/192 |
| 5,712,078 A | 1/1998 | Huang et al. | 430/270.1 |
| 5,919,597 A | 7/1999 | Sinta et al. | 430/270.1 |
| 5,985,524 A | 11/1999 | Allen et al. | 430/326 |
| 6,037,097 A | 3/2000 | Bucchignano et al. | 430/270.1 |
| 6,043,003 A | 3/2000 | Bucchignano et al. | 430/326 |
| 6,136,501 A | * 10/2000 | Trefonas, et al. | 430/270.1 |
| 6,261,738 B1 | * 7/2001 | Asakura et al. | 430/270.1 |
| 6,306,555 B1 | * 10/2001 | Schulz et al. | 430/270.1 |
| 6,335,143 B1 | * 1/2002 | Sumino et al. | 430/280.1 |
| 6,379,861 B1 | * 4/2002 | Trefonas, et al. | 430/270.1 |

OTHER PUBLICATIONS

R. Kwong et al., "A New High Performance CA Resist for E–beam Lithography," Material Resource Society Symposium Proceedings, 7 pages, 2000.

T. Mukaiyama et al., "Immobilized Catalyst Directed to Synthetic Control. Cross–Aldol Reaction," Chemistry Letters, The Chemical Society of Japan, pp. 1363–1366, 1985.

* cited by examiner

Primary Examiner—John S. Chu
(74) Attorney, Agent, or Firm—Ryan, Mason & Lewis, LLP; Daniel P. Morris, Esq.

(57) ABSTRACT

A chemically amplified resist composition comprises an aqueous base soluble polymer or copolymer having one or more polar functional groups, wherein at least one of the functional groups is protected with a cycloaliphatic silyl ketal group but may also include other protecting groups as well as unprotected acidic functionalities. A ratio of protected to unprotected acidic functionalities is preferably selected to most effectively modulate a solubility of the resist composition in an aqueous base or other developer. The resist composition further comprises an acid generator, preferably a photoacid generator (PAG), and a casting solvent, and may also include other components, such as, a base additive and/or surfactant.

33 Claims, 2 Drawing Sheets

KP  RNL
SiLOCH NO PEB  8UC/CM2 200 X 200 L/S
PMT:28%  100nm
P:100,000X  15.0kV  #0001*

KP  RNL
SiLOCH NO PEB  8UC/CM2 250 X 250 L/S
PMT:28%  100nm
P:100,000X  15.0kV  #0001*

RESIST COMPOSITIONS COMPRISING SILYL KETALS AND METHODS OF USE THEREOF

STATEMENT OF GOVERNMENT RIGHTS

This invention was made with Government support under contract number N66001-99-C-8624 awarded by the Defense Advanced Research Projects Agency (DARPA) of the United States Department of Defense. The Government has certain rights in this invention.

FIELD OF THE INVENTION

The present invention relates to a silyl ketal functionality incorporated into a polymeric material, radiation-sensitive compositions containing this functionalized polymeric material, and methods of using these radiation-sensitive compositions to produce patterns. More particularly, the invention relates to the use of silyl ketal protected, base soluble polymers in chemically amplified resist compositions and methods for using these resist compositions in lithographic imaging.

BACKGROUND OF THE INVENTION

Lithography, which is the patterning of radiation-sensitive polymeric films with a source of activating energy, including high-energy radiation sources such as photons, electrons, or ion beams, is a principle means of defining high-resolution circuitry in the manufacture of semiconductor devices. These radiation-sensitive films, or photoresists, generally consist of multiple component formulations that are usually spin-coated onto a desired semiconducting substrate such as, for example, a silicon wafer, and are patternwise imaged with radiation. The radiation is most commonly ultraviolet light of wavelengths 248 nanometer (nm), 193 nm, or 157 nm, a beam of electrons or ions, or soft x-ray radiation, also known as extreme ultraviolet (EUV) at a wavelength of approximately 13 nm. This radiation induces a chemical transformation that renders the solubility of the exposed regions different from that of the unexposed regions in a chosen resist developer, most commonly an aqueous solution of tetramethylammonium hydroxide or another aqueous alkali solution.

The most commonly employed of these resist formulations in high-resolution imaging (e.g., features less than 250 nm in width) are of a class of materials termed chemically amplified, in which the aforementioned radiation-induced chemical transformation is catalytic in nature and thus results in multiple chemical reactions for each photon, ion or electron absorbed by the film. Chemically amplified resists (CARs) allow for high-resolution, high-contrast and high-sensitivity that are not afforded by other resists. Positive tone CARs are typically composed of an intrinsically aqueous alkali-soluble polymer, such as poly(4-hydroxystyrene), poly(norbornenecarboxylic acid, poly(acrylic acid), poly (methacrylic acid), and similar structures, as well as copolymers, terpolymers, or higher order polymers containing these repeat units, that have been rendered insoluble by the partial protection of its solubilizing moieties with acid labile protecting groups. These protecting groups are cleaved by strong acid that is produced within the film by the exposure of photoacid generators (PAGs)—compounds that have been formulated with the polymer in the resist composition.

The protecting groups are often classified by their activation energy, or the amount of energy required to be supplied to the system after the formation of strong acid that will result in a suitable degree of deprotection within the resist polymers to render a change in their aqueous base solubility. Protecting groups that require an activation energy in excess of 30 kcal/mol are often termed high activation energy resists. Examples of protecting groups that are in this category are tertiary butyl esters and isopropyl esters of carboxylic acids. Protecting groups with activation energies less than 25 kcal/mol are often referred to as low activation energy resists, for example acetals. Additionally, other protecting groups, such as tertiary butyl carbonates, fall into an intermediate range of activation energies (e.g., 25 to 30 kcal/mol) and are thus classified as mid-activation energy resists. The energy required to overcome the activation barrier and to allow deprotection is most often supplied by post-exposure baking (PEB) of the resist films.

Conventionally, low activation energy protection groups, such as ketals, acetals, or silyl ethers have been incorporated into polymeric materials for the proposed use as imaging materials for the production of electronic devices, as described, for example, in U.S. Pat. Nos. 5,712,078, 6,037, 097 and 6,043,003. These materials have some attractive advantages over high activation energy systems. Most notably, the low activation energy resist comprised of ketal protected poly(4-hydroxystyrene) known as KRS (ketal resist system), as described, for example, in U.S. Pat. Nos. 6,043,003 and 6,037,097, tend to be far less sensitive to the effects of post-exposure delay (PED).

PED, which refers to the time between exposure and subsequent processing (e.g., post-exposure baking, etc.) of a resist film, has been shown to result in line width variation and/or poisoning of the resist film by prolonged exposure to certain contaminants (e.g., atmospheric contaminants) that in turn results in deleterious acid neutralization at the film-air interface and yields structures with unacceptable profiles. As the deprotection reaction in many low activation energy CARs occurs at or near ambient temperature, (e.g., 20 to 25 degrees Celsius (° C.)), these KRS resist films are not susceptible to PED. Furthermore, the KRS photoresists have been shown to produce films that are stable under proper storage conditions to upward of 30 days, are independent of PEB-induced line width variations (e.g., <1 nm/° C.) over a temperature range of from 80° C. to 120° C., and can be successfully processed without employing PEB. These features make the KRS resists particularly attractive for e-beam exposures, either for use in e-beam projection lithography (EPL) for semiconductor device manufacture or with direct-write exposure systems in the production of photolithography masks.

In order for the semiconductor industry to progress to sub-100 nm features, next generation lithography (NGL) options are being developed. Despite the differences in the various NGL strategies such as EPL, EUV, or 157 nm optical lithography, all will require the use of thin resist films to accommodate the mechanical stability necessary in printing high-resolution features. Currently used resist film thickness (e.g., typically 300 nm to 1000 nm) would result in aspect ratios in excess of 3.0 for sub-100 nm images. It has been shown that aspect ratios greater than about 3.5 result in image collapse during post-development aqueous rinsing. Furthermore, thinner resists are required for improved resolution and depth-of-focus. However, by employing thinner resists, the effectiveness of the resist as an etch barrier is significantly diminished.

One method for imparting increased etch resistance to conventional resist materials is the incorporation of organometallic species in the resist composition. Examples of this include the covalent attachment of silicon, germanium and tin containing moieties into the polymeric structure of the resist matrix, or the blending of small molecule and/or polymeric organometallic materials. This technique allows for nonvolatile oxides, halides, and/or oxyhalides to form during the etch process when the plasma employed contain oxygen, halogens, or haloalkane (e.g., fluorocarbon) chemistries. However, resist materials formed using this conventional approach are subjected to post-exposure delay and the aforementioned disadvantages associated therewith (e.g., resist poisoning, etc.).

Thus, there exits a need for high-resolution, stable resist compositions having increased etch resistance and that can be employed in lithographic imaging (i.e., lithographic patterning) techniques and the like.

SUMMARY OF THE INVENTION

It is an object of the present invention to provide a chemically amplified resist composition having improved etch resistance and hydrolytic stability while maintaining high resolution and robust process latitude which can be employed, for example, in nanoscale lithographic patterning.

It is another object of the present invention to use a cycloaliphatic silyl ketal as an acid labile protecting group for derivatizing intrinsically base soluble polymers, and utilizing such polymers in chemically amplified resist systems.

Advantageously, the present invention addresses the need for a high resolution, stable resist composition having increased etch resistance by combining a low activation energy protecting group and an organometallic species into the same chemical functionality, namely, a silyl ketal. Specifically, the present invention provides a multicomponent chemically amplified resist prepared from, among other constituents, an initially base soluble polymeric material that has been at least partially protected with a silyl ketal group, but may also contain other protecting groups as well as unprotected acidic functionalities, the ratio of which is selected to most effectively modulate a solubility of the resist composition in an aqueous base or other developer. Furthermore, the novel use of a silyl ketal functionality as a protecting group for polymeric acidic (e.g., acid dissociation constant pKa<14) oxygen containing moieties provides desirable absorption characteristics of the resist composition, specifically for 157 nm optical lithography, due to an intrinsic transparency of this functional group at a wavelength of around 157 nm.

A resist composition, in accordance with one aspect of the invention, comprises an aqueous base soluble polymer or copolymer having one or more polar functional groups, wherein at least one of the functional groups is protected with a cycloaliphatic silyl ketal group but may also include other protecting groups as well as unprotected acidic functionalities. The resist composition further comprises an acid generator, preferably a photoacid generator (PAG), and a casting solvent, and may also include a base and/or a surfactant.

In accordance with another aspect of the invention, a method of patterning a desired substrate, such as, for example, a silicon wafer, a chrome-on-glass mask blank, or a printed circuit board, is provided. The method may include the following steps: applying a coating of resist composition containing an inherently aqueous base soluble polymeric material that is at least partially protected with a cycloaliphatic silyl ketal group to the desired substrate; patternwise exposing the resist film to an imaging radiation source; developing and removing exposed areas of the resist film; etching into the substrate in the exposed areas using an etching process; and removing any remaining resist from the substrate, for example, using a stripping agent.

In accordance with another embodiment of the invention, the resist compositions described herein may be employed as an imaging layer in a bilayer resist system, preferably by coupling the resist composition with an organic underlayer composition. In this illustrative embodiment, the resist composition is not applied directly to the substrate but is applied to an organic underlayer which is applied to the substrate. The method may include the following steps: applying an organic underlayer composition to the substrate; applying an imaging layer to the underlayer, the imaging layer comprising a resist composition containing a polymeric material that is at least partially protected with a silyl ketal group; patternwise exposing the resist composition to an imaging radiation source; developing and removing areas of the resist composition exposed to the imaging radiation source; etching into the underlayer in the exposed areas; etching into the substrate in areas exposed by the underlayer etching step; and removing any remaining resist composition and underlayer composition from the substrate.

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENT

Figure 1A:
FIG. 1 is a scanning electron micrograph (SEM) illustrating patterned images formed using a coated resist film developed with a post-exposure bake (PEB), in accordance with one aspect of the invention.

The present invention, in one aspect, provides improved chemically amplified (CA) resist compositions that are useful, for example, in conjunction with lithographic imaging systems. A resist composition in accordance with one aspect of the invention preferably comprises an aqueous base soluble polymer or copolymer having one or more polar functional groups, wherein at least one of the functional groups is protected with a cycloaliphatic silyl ketal group but may also include other protecting groups as well as unprotected acidic functionalities. A ratio of protected to unprotected acidic functionalities is preferably selected to most effectively modulate a solubility of the resist composition in an aqueous base or other developer. The resist composition further comprises an acid generator, preferably a photoacid generator (PAG), and a casting solvent, and may also include a base and/or a surfactant.

In an illustrative embodiment of the invention, the polymer or copolymer, having been at least partially protected with a silyl ketal group, has the following generic form:

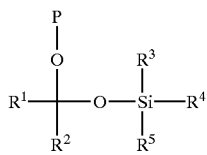

where P represents a polymer chain or backbone, O represents an oxygen atom, Si represents a silicon atom, and $R^1$, $R^2$, $R^3$, $R^4$ and $R^5$ represent individually selected substituted or unsubstituted aliphatic, cycloaliphatic and/or aromatic groups, or derivatives thereof. It is to be appreciated that these groups may be linear or branched and may be attached to each other to form cyclic species preferably containing from about 1 to about 16 carbon atoms. Furthermore, these groups may be derivatized and contain heteroatoms. Additionally, the groups bonded to the silicon atom (Si), represented by $R^3$, $R^4$ and $R^5$, may be tri-substituted silyl groups. In all cases, the silyl ketal is derived from an α-siloxyalkene, examples of which include 2-trimethylsiloxypropene, 1-trimethylsiloxycyclohexene, and 1-(tris(trimethylsilyl)siloxy)-cyclohexene, as shown schematically below (in order from left to right):

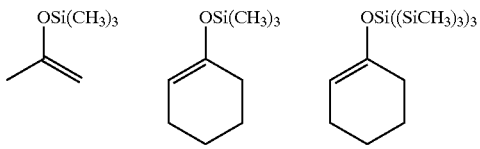

As stated above, the aqueous base soluble polymer or copolymer employed in the present invention includes a polymer backbone or parent polymer such as, but not limited to, acrylic, styrenic, cycloaliphatic groups, or a similar hydrocarbon structure. Similarly, the polymer backbone may include organometallic species functionalities as well, such as, for example, silicon, germanium and tin containing moieties such as, but not limited to, silsesquioxanes, siloxanes, or carbosilanes. In accordance with the invention, the polymer backbone is preferably selected from a group of polymers that contains inherently base solubilizing functionalities. Polymers in this class include, but are not limited to, poly(4-hydroxystyrene), poly(acrylic acid), poly (methacrylic acid), poly(norbornenecarboxylic acid, poly (norbornene-2-hexafluoropropanol); copolymers of these monomers with other monomers, as well as terpolymers and higher order copolymers. These polymers are reacted (as described below) with siloxycycloalkenes to produce partially protected polymers containing the acid labile silyl ketal protecting group.

Base soluble polymers suitable for use with the present invention are known by those skilled in the art. A preferred polymer backbone for use with the present invention is a phenolic-containing resin such as, but not limited to, poly (p-hydroxystyrene), poly(m-hydroxystyrene), poly(o-hydroxystyrene) or substituted polymers thereof. By way of example only, for electron-beam (e-beam) or 248 nm optical exposure, a preferred polymer backbone is poly(4-hydroxystyrene) (PHS) and copolymers thereof. More preferably, the polymer backbone is poly(4-hydroxystyrene) or poly(4-hydroxystyrene-co-4-vinylcyclohexanol) at a molar ratio of about 10–20 to 1, respectively. A preferred number average molecular weight ($M_N$) of these materials is about 2,000 Daltons to about 500,000 Daltons, but is most preferred in a range between about 5,000 Daltons to about 30,000 Daltons. It is to be appreciated that for other exposure sources, other polymers may be more suitable for use with the present invention. For example, the cycloaliphatics and/or copolymers or terpolymers thereof may be more suitable for 193 nm or 157 nm optical lithography. A preferred siloxycycloalkene used to generate the silyl ketal with the phenolic sites of this polymer in the present invention is 1-trimethylsiloxycyclohexene. A preferred level of protection is in a range from about 10 percent to about 80 percent, and more preferably the level of protection is in a range from about 20 percent to about 30 percent.

The synthesis of the protected polymer may be performed by direct reaction of the α-siloxyalkene with the polymer in the same solvent as that of the ultimate formulation, such as, but not limited to, propyleneglycol methyl ether acetate (PGMEA), cyclohexanone, or ethyl lactate, thus eliminating the need for polymer isolation. An acid, such as, but not limited to, p-toluenesulfonic acid, oxalic acid, or malonic acid, is preferably used to catalyze the reaction and can be removed, for example, by slurrying the polymeric solution with basic aluminum oxide.

A process for preparing a resist polymer in its ultimate casting solvent which is suitable for use with the present invention has been previously described in detail, for example, in U.S. Pat. No. 5,919,597, which is incorporated herein by reference, and is shown schematically below for the preferred system described herein:

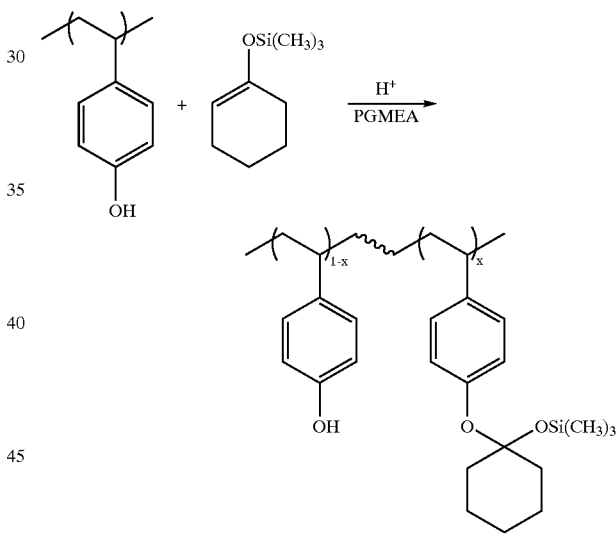

In accordance with another aspect of the invention, the protected polymer may also be synthesized by direct copolymerization of monomers, at least one of which contains the silyl ketal functionality. Alternatively, the protected polymer may be prepared by reaction of the base polymer with a siloxycycloalkene, isolated and dried to a constant weight by conventional methods known by those skilled in the art. The degree of protection, represented in the above schematic diagram as x (percentage), may be from about 10 percent to about 80 percent of the acidic functionalities, and more preferably is between about 20 percent and about 30 percent.

The acid generator employed in the chemically amplified resist composition of the present invention is preferably a radiation-sensitive acid generator, often referred to as a photoacid generator (PAG). PAGs are compounds which generate strong acids upon exposure to energy. The PAG may be employed herein, as is common in the prior art, for deprotection of an acid labile protecting group. PAGs are described, for example, in U.S. Pat. No. 5,258,257, which is incorporated herein by reference, and therefore a detailed discussion will not be presented herein.

PAGs that are suitable for use with the present invention are not limited to any particular family of materials. That is, the advantages of the present invention may be achieved using a variety of different acid generators. Illustrative classes of such acid generators include, for example, onium salts, sulfonate esters, imidosulfonates, phenolic sulfonates, naphthoquinone-4-diazides, or similar species that generate a strong Brønsted acid upon exposure to an appropriate radiation source. Preferred acid generators include, but are not limited to, triarylsulfonium perfluoro-alkanesulfonates and diaryliodonium perfluoro-alkanesulfonates, and especially triphenylsulfonium perfluoro-octanesulfonate (TPS PFOS), triphenylsulfonium triflate (TPS Tf), and bis(t-butylphenyl)iodonium perfluoro-octanesulfonate, and other closely related structures of these types. More preferably, acid generators suitable for use with the invention include onium salts containing a perfluorinated or semifluorinated anion, such as, without limitation, triphenylsulfonium triflate, 4-t-butylphenyl diphenylsulfonium perfluoro-octanesulfonate, and bis(4-t-butylphenyl)iodonium nonaflate, which are shown schematically below (in order from left to right):

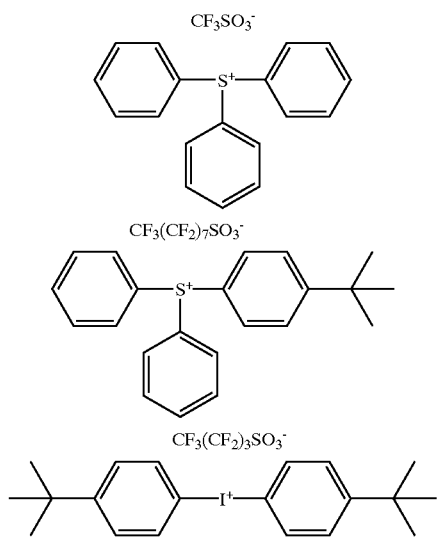

The resist formulations of the present invention preferably contain about 0.25 weight percent (wt %) to about 15 wt % acid generator, as based relative to the weight of the polymer. More preferably, the resist formulations of the invention contain about 2 wt % to about 10 wt % acid generator.

The resist compositions of the present invention may also include a base additive which functions, at least in part, to modify a diffusivity of radiation-generated acid and to help stabilize the shelf life of the resist formulations to prolonged storage (e.g., upwards of 30 days). Preferred base additives include, for example, tetraalkylammonium hydroxides or secondary and tertiary amines of low volatility. Base additives that are suitable for use with the present invention include, but are not limited to, 1, 8-diazabicyclo[5.4.0] undec-7-ene, tetrabutylammonium hydroxide, (2-hydroxyethyl)piperidine, tricyclohexylamine, or other related structures. When used, the wt % of the base additive, as based relative to the weight of the polymer, is generally less than about 2 wt %, and more preferably is less than about 1 wt %.

Other components, such as, but not limited to, surfactants, stabilizers and dyes, may also be included in the resist formulations of the present invention at least in part to optimize the performance and/or maximize the advantages of the invention described herein. Preferred surfactants suitable for use with the present invention include, for example, alkanesulfonate, perfluorinated alkanesulfonate salts, and/or other commonly employed surfactants. In general, these other components, when used, preferably comprise less than about 1 wt % of the resist composition.

The resist compositions of the present invention may be prepared by combining the components (e.g., polymer, solvent, acid generator, base, and/or auxiliary components) using conventional methods known to those skilled in the art. In cases where the polymer is prepared in the ultimate casting solvent, it may not be necessary to add additional solvent. In cases where the polymer is isolated (i.e., dry), the addition of solvent is generally necessary. Solvent content can be adjusted to provide a desired viscosity and weight percent solids. Generally, the weight-percent solvent is about 50 wt % to about 99 wt %, based on the weight of the total formulation, but is preferably about 70 wt % to about 96 wt %. More preferably, the weight-percent solvent range is about 85 wt % to about 95 wt % solvent. Preferred solvents that can be used with the present invention include, but are not limited to, PGMEA, cyclohexanone, ethyl lactate and the like.

The resist compositions of the present invention are particularly useful as radiation-sensitive resists employed in the manufacture of electronic parts, especially semiconductor devices, or in the manufacture of photolithography masks using optical, electron beam, ion beam or x-ray radiation. For example, the previously described poly(4-hydroxystyrene) based material is particularly useful with e-beam radiation, as in projection electron beam lithography or in direct-write applications. Moreover, the resist compositions of the present invention may be employed for patterning printed circuit boards or photolithographic masks (i.e., photomasks) in a similar manner. It is to be appreciated that, in accordance with another aspect of the invention, the resist compositions described herein may be employed as an imaging layer in a bilayer resist system, for example, by coupling the resist composition with an organic underlayer composition.

The present invention encompasses a method of patterning a desired substrate, such as, for example, a silicon wafer, a chrome-on-glass mask blank, or a printed circuit board. The method may include the following steps: applying a coating of resist composition containing an inherently aqueous base soluble polymeric material that is at least partially protected with a silyl ketal group, as previously described herein, to the desired substrate; patternwise exposing the resist composition to an imaging radiation source; developing and removing exposed areas of the resist composition, for example by treatment with a developer, preferably an aqueous base; etching into the substrate in the exposed areas using an etching process that may include, but is not limited to, a reactive ion etch using a halogen containing plasma such as, for example, $CF_4$, $Cl_2/HBr$, $Cl_2/O_2$, or other suitable plasmas; and removing any remaining resist composition from the substrate, for example, using a stripping agent.

In accordance with another embodiment of the invention, the resist compositions described herein may be similarly employed as an imaging layer in a bilayer resist system, preferably by coupling the resist composition with an organic underlayer composition, as stated above. In this embodiment, the resist composition is not applied directly to the substrate but rather is applied to an organic underlayer composition which is applied to the substrate. Moreover, a two-step etching process is preferably utilized, whereby the first etching process is employed to etch predetermined areas in the underlayer composition in which the resist composition was exposed to the imaging radiation source, and a second etching process is employed to etch into the substrate.

Pre-application, post-application, post-exposure, and post-development processes such as, for example, application of an anti-reflective coating, substrate priming, baking, flood exposure, or vapor treatment, may also be incorporated into the methodologies of the invention at least in part to enhance the performance and/or advantages of the present invention. In particular, the incorporation of a post-application bake (PAB) to remove residual casting solvent of the resist film is highly desirable. A PAB process may include baking the desired substrate (e.g., wafer), at a temperature of about 80° C. to about 120° C. for a period of about 10 seconds to about 120 seconds. A preferred PAB is at 110° C. for 60 seconds.

Additionally, it may be desirable to include a post-exposure bake (PEB) in a manner consistent with the PAB methodology described above. Although it is not necessary for performance of many low activation energy chemically amplified resists, a PEB may be included to enhance lithographic imaging quality. A PEB process may include baking the wafer or substrate at a temperature of about 80° C. to about 120° C. for a period of about 10 seconds to about 120 seconds. A preferred PEB is at 110° C. for 60 seconds. It is to be appreciated that both PAB and PEB processes may be accomplished using conventional methods understood by those skilled in the art, such as, for example, contact hot plate baking, oven baking, proximity baking, etc. It may also be desirable to incorporate prior treatment of the substrate with a surface priming agent including, but not limited to, conventional silylating agents such as, for example, hexamethyldisilazane and/or related species by techniques known to those skilled in the art. Illustrative techniques suitable for use with the present invention include, without limitation, vapor priming and liquid puddle application.

Although illustrative embodiments of the present invention have been described herein, it is to be understood that the invention is not limited to those precise embodiments, and that various other changes and modifications may be effected therein by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLES

Example 1

Synthesis of poly(4-hydroxystyrene-co-4-(1-trimethylsiloxy-1-cyclohexyloxy)styrene)

Poly(4-hydroxystyrene) (17.5 grams) was dissolved in propylene glycol methyl ether acetate (PGMEA) (100 milliliters) that had been previously dried over activated molecular sieves to remove water. The polymeric solution was further dried by bubbling nitrogen gas through the solution for one hour. While maintaining a slight positive pressure of nitrogen over the solution, oxalic acid (25 milligrams) was added and the solution was allowed to stir for ten minutes. 1-Trimethylsiloxy-1-cyclohexene (7.44 grams) was added dropwise over 15 minutes. After an additional 18 hours of stirring at room temperature, basic activated alumina (10 grams) was added and the slurry was allowed to stir for 20 minutes to remove residual acid catalyst. The polymeric solution was filtered to remove the alumina and diluted with an additional 80 milliliters of PGMEA to afford an approximately 12 weight percent (wt %) solution. Carbon-13 Nuclear Magnetic Resonance ($^{13}$C-NMR), Fourier Transform Infrared (FTIR) spectroscopy, and Thermogravimetric Analysis (TGA) confirmed the product as the desired partially protected (30 mol-%) polymer.

Example 2

Preparation of and Imaging with Resist Formulation

Figure 1B:
Figure 2A:
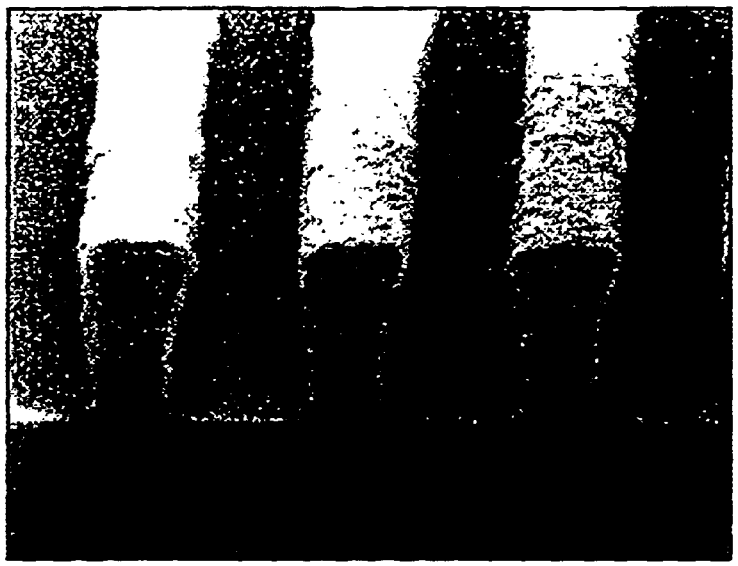
FIG. 2 is an SEM illustrating patterned images formed using the coated resist film of FIG. 1 developed without a PEB, in accordance with another aspect of the invention.
Figure 2B:
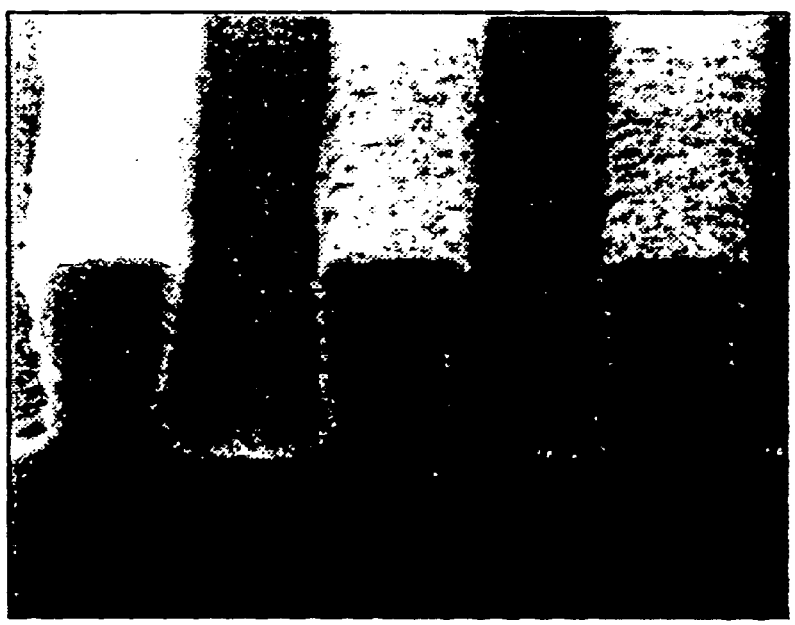

The polymeric solution of Example 1 was mixed with triphenyl sulfonium triflate as a PAG and tetrabutylammonium hydroxide as a base. The formulation was allowed to mix for two hours and then passed through a 0.2 micrometer ($\mu$m) filter. The formulation was applied to an HMDS-primed silicon (Si) wafer by spin casting and excess solvent was removed by post-application baking at a temperature of 110° C. for 60 seconds. The coated resist film was imaged patternwise on a 25 kiloelectron-volt (keV) electron beam exposure tool. After exposure, the film was post-exposure baked (PEB) at a temperature of 110° C. for 60 seconds and developed in 0.263 N tetramethylammonium hydroxide for 60 seconds. The resulting patterned images are shown in the scanning electron micrographs (SEMs) of FIG. 1. Alternatively, the resist may be developed without a PEB, the resulting images of which are illustrated in the SEMs of FIG. 2.

What is claimed is:

1. A chemically amplified resist composition comprising:
   a polymer or copolymer having one or more polar functional groups, wherein at least one of the functional groups is protected whit a cycloaliphatic silyl ketal group;
   an acid generator; and
   a solvent for the polymer or copolymer.

2. The chemically amplified resist composition of claim 1, wherein the silyl ketal group is derived from an α-siloxycycloalkene.

3. The chemically amplified resist composition of claim 2, wherein the α-siloxyalkene is selected from the group consisting of 1-trimethylsiloxycyclohexene and 1-(tris(trimethylsilyl)siloxy)-cyclohexene.

4. The chemically amplified resist composition of claim 1, wherein the polymer or copolymer further includes a polymer backbone, wherein the polymer backbone comprises at least one of acrylic, styrenic and cycloaliphatic groups.

5. The chemically amplified resist composition of claim 1, wherein the polymer or copolymer further includes a polymer backbone, wherein the polymer backbone comprises one or more polymers selected from the group consisting of poly(4-hydroxystyrene), poly(acrylic acid), poly (methacrylic acid), poly(norborhenecarboxylic acid) and poly(norbornene-2-hexafluoropropanol).

6. The chemically amplified resist composition of claim 1, wherein the polymer or copolymer further includes a polymer backbone, wherein the polymer backbone comprises one or more organometallic species functionalities.

7. The chemically amplified resist composition of claim 6, wherein the one or more organometallic species functionalities are selected from the group consisting of silicon, germanium and tin containing moieties.

8. The chemically amplified resist composition of claim 1, wherein the polymer or copolymer is a phenolic-containing resin.

9. The chemically amplified resist composition of claim 8, wherein the phenolic-containing resin is poly(p-hydroxystyrene), poly(m-hydroxystyrene), poly(o-hydroxystyrene), or substituted polymers thereof.

10. The chemically amplified resist composition of claim 1, further comprising at least one of a base additive, a surfactant, a stabilizer and a dye.

11. The chemically amplified resist composition of claim 10, wherein the base additive is selected from the group consisting of 1, 8-diazabicyclo[5.4.0]undec-7-ene, tetrabutylammonium hydroxide, (2-hydroxyethyl)piperidine and tricyclohexylamine.

12. The chemically amplified resist composition of claim 1, wherein the polymer or copolymer further includes unprotected acidic functionalities, wherein a ratio of protected to unprotected functional groups is selected to modulate a solubility of the chemically amplified resist in an aqueous base developer.

13. The chemically amplified resist composition of claim 1, wherein the acid generator is a radiation-sensitive acid generator.

14. The chemically amplified resist composition of claim 13, wherein the radiation-sensitive acid generator is selected from the group consisting of onium salts, imidosulfonates, phenolic sulfonates and naphthoquinone-4-diazides.

15. The chemically amplified resist composition of claim 13, wherein the radiation-sensitive acid generator is an onium salt including a perfluorinated or semifluorinated anion.

16. The chemically amplified resist composition of claim 15, wherein the perfluorinated or semifluorinated anion is selected from the group consisting of triphenylsulfonium triflate, 4-t-butylphenyl diphenylsulfonium perfluorooctanesulfonate and bis(4-t-butylphenyl)iodonium nonaflate.

17. The chemically amplified resist composition of claim 1, wherein the solvent is selected from the group consisting of glycol ethers, aromatic hydrocarbons, lactones and esters.

18. The chemically amplified resist composition of claim 1, wherein the solvent is selected from the group consisting of propyleneglycol methyl ether acetate (PGMEA), cyclohexanone and ethyl lactate.

19. The chemically amplified resist composition of claim 1, wherein the resist comprises from about 0.25 weight percent (wt %) to about 15 wt % of the acid generator, and from about 50 wt % to about 99 wt % of the solvent.

20. The chemically amplified resist composition of claim 19, wherein the resist comprises from about 2 weight percent (wt %) to about 10 wt % of the acid generator, and from about 70 wt % to about 96 wt % of the solvent.

21. A method of patterning a substrate comprising the steps of:
    applying a coating of resist composition to the substrate, the resist composition comprising a polymeric material that is at least partially protected with a cycloaliphatic silyl ketal group;
    patternwise exposing the resist composition to an imaging radiation source;
    developing and removing areas of the resist composition exposed to the imaging radiation source;
    etching into the substrate in the exposed areas; and
    removing any remaining resist composition from the substrate.

22. The method of claim 21, wherein the step of etching comprises ion etching using a halogen containing plasma.

23. The method of claim 22, wherein the plasma is selected from the group consisting of $CF_4$, $Cl_2/HBr$ and $Cl_2/O_2$.

24. The method of claim 21, wherein the step of removing the remaining resist composition from the substrate comprises contacting the substrate with a stripping agent.

25. The method of claim 21, further comprising the step of:
    synthesizing the polymeric material that is at least partially protected with a cycloaliphatic silyl ketal group by direct copolymerization of monomers, at least one of the monomers including a cycloaliphatic silyl ketal functionality.

26. The method of claim 21, further comprising the step of:
    synthesizing the polymeric material, the polymeric material including a base polymer, by a reaction of the base polymer with a siloxycycloalkene, the polymeric material being isolated and dried to a constant weight.

27. The method of claim 21, wherein the substrate is at least one of a silicon wafer, a photolithographic mask blank and a printed circuit board.

28. A method of patterning a substrate comprising the steps of:
    applying an organic underlayer composition to the substrate;
    applying an imaging layer to the underlayer, the imaging layer comprising a resist composition containing a polymeric material that is at least partially protected with a cycloaliphatic silyl ketal group;
    patternwise exposing the resist composition to an imaging radiation source;
    developing and removing areas of the resist composition exposed to the imaging radiation source;
    etching into the underlayer in the exposed areas;
    etching into the substrate in areas exposed by the underlayer etching step; and
    removing any remaining resist composition and underlayer composition from the substrate.

29. The method of claim 28, wherein the steps of etching the underlayer and substrate comprises ion etching using a halogen containing plasma.

30. The method of claim 29, wherein the plasma is selected from the group consisting of $CF_4$, $Cl_2/HBr$ and $Cl_2/O_2$.

31. The method of claim 28, wherein the step of removing the remaining resist composition and underlayer composition from the substrate comprises contacting the substrate with a stripping agent.

32. The method of claim 28, further comprising the step of:
    synthesizing the polymeric material that is at least partially protected with a silyl ketal group by direct copolymerization of monomers, at least one of the monomers including a cycloaliphatic silyl ketal functionality.

33. The method of claim 28, further comprising the step of:
    synthesizing the polymeric material, the polymeric material including a base polymer, by a reaction of the base polymer with a siloxycycloalkene, the polymeric material being isolated and dried to a constant weight.

* * * * *